United States Patent
Priel et al.

(10) Patent No.: US 9,438,236 B2
(45) Date of Patent: Sep. 6, 2016

(54) INPUT/OUTPUT DRIVER CIRCUIT, INTEGRATED CIRCUIT AND METHOD THEREFOR

(75) Inventors: Michael Priel, Netanya (IL); Dan Kuzmin, Givat Shmuel (IL); Sergey Sofer, Rishon Lezion (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/409,310

(22) PCT Filed: Jul. 6, 2012

(86) PCT No.: PCT/IB2012/053471
§ 371 (c)(1),
(2), (4) Date: Dec. 18, 2014

(87) PCT Pub. No.: WO2014/006454
PCT Pub. Date: Jan. 9, 2014

(65) Prior Publication Data
US 2015/0180475 A1    Jun. 25, 2015

(51) Int. Cl.
*H03K 19/0175* (2006.01)
*H03K 19/003* (2006.01)
*H03K 19/0185* (2006.01)

(52) U.S. Cl.
CPC ...... *H03K 19/017509* (2013.01); *H03K 19/00384* (2013.01); *H03K 19/018521* (2013.01)

(58) Field of Classification Search
CPC ............... H03K 19/01759; H03K 19/018507; H03K 19/018521
USPC ........... 327/108, 109, 110, 111, 112; 326/82, 326/83, 87
See application file for complete search history.

(56) References Cited

U.S. PATENT DOCUMENTS

| | | | |
|---|---|---|---|
| 5,122,690 A | 6/1992 | Bianchi | |
| 5,410,267 A | 4/1995 | Haycock et al. | |
| 5,805,505 A * | 9/1998 | Zheng | G11C 7/1051 326/57 |
| 5,831,447 A * | 11/1998 | Chaw | H03K 19/00361 326/27 |
| 5,877,647 A | 3/1999 | Vajapey et al. | |
| 6,133,749 A | 10/2000 | Hansen et al. | |
| 8,022,723 B1 | 9/2011 | Wang et al. | |
| 8,410,818 B1 * | 4/2013 | Hsu | H03K 19/0013 326/27 |
| 2003/0112041 A1 | 6/2003 | Clark et al. | |
| 2007/0200592 A1 | 8/2007 | Kim et al. | |
| 2010/0301905 A1 * | 12/2010 | Kanda | H03K 19/01721 327/109 |

OTHER PUBLICATIONS

International Search Report and Written Opinion correlating to PCT/IB2012/053471 dated Mar. 6, 2013.

* cited by examiner

*Primary Examiner* — William Hernandez

(57) ABSTRACT

An input/output (IO) driver circuit is described. The IO buffer driver circuit comprises: at least one input for receiving an input signal and at least one output for providing at least one output signal; and a plurality of switches arranged to provide a variable voltage level between a low voltage value and a high voltage value to the at least one output. The at least one first switch of the plurality of switches is arranged to initiate a voltage change to an intermediate voltage level between the low voltage value and the high voltage value in a first time period. The at least one second switch of the plurality of switches is arranged to continue the voltage change to the low voltage value or the high voltage value in a second time period.

18 Claims, 6 Drawing Sheets

INPUT/OUTPUT DRIVER CIRCUIT, INTEGRATED CIRCUIT AND METHOD THEREFOR

FIELD OF THE INVENTION

The field of this invention relates to an input/output driver circuit, integrated circuit and method therefor, and in particular but not exclusively to an input/output driver circuit for controlling a voltage transition swing.

BACKGROUND OF THE INVENTION

In the field of integrated circuit (IC) devices, a speed of being able to turn semiconductor devices and circuits 'on' or 'off' is known to be an important performance factor. The speed at which a semiconductor switch can be turned 'on' and 'off' is often related to how fast a gate capacitance of the semiconductor switch can be charged and discharged. FIG. 1 illustrates a voltage switching waveform 100 for a typical semiconductor switch. A driver (not shown) controls a transition time ($T_{RISE}$ and $T_{FALL}$) 110, 120 of the voltage switching waveform 100 from a low voltage level to a high voltage level. Whilst input/output (IO) speed for modern ICs is increasing, the required load capacitance is barely decreasing. This limits an ability of drivers to decrease this transition time.

A straightforward solution to reducing this transition time is to use termination. FIG. 2 illustrates a simplified termination circuit 200 utilising load termination. Load termination is typically arranged at mid-point of a supply voltage, often achieved by connecting a resistor to a special voltage source, or set using two resistors—one connected to ground and another connected to the supply voltage.

Termination circuit 200 comprises I/O switching drivers 210, 215, operably coupled to respective pull-up/pull-down switches 220, 225. Pull-up/pull-down switches 220, 225 are at least operably coupled to voltage supply 250 and ground 255, respectively. Input/output (I/O) pad 240 is operably coupled between pull-up/pull-down switches 220, 225. A resistive device, in this case resistor 230, is operably coupled between I/O pad 240 and ground 255. I/O switching driver 210 controls, in this example, pull-up switch 220. The resistor 230 causes the voltage at I/O pad 240 to reside at a voltage level between ground and a supply voltage 250, denoted intermediate voltage 260, when I/O switching driver 210 drives pull-up switch 220 'high'. This intermediate voltage 260 is dependent upon an impedance ratio between pull-up switch 220 and resistor 230. In order to reverse the voltage transition, pull-up switch 220 is turned 'off' by I/O switching driver 210, and, in this example, pull-down switch 225 is turned 'on' by I/O switching driver 215, thereby pulling intermediate voltage 260 'low'. The switching transition between intermediate voltage 260 and ground is faster than if pull-down switch 225 was switching from supply voltage 250 and ground, as illustrated in voltage waveform 270. Utilising the resistor 230 results in transition times ($T_{RISE}$ and $T_{FALL}$) 280, 285 being faster than the transition time 110, 120 from FIG. 1 (for a circuit without resistor 230).

A drawback with the above illustrated example is that resistor 230 consumes current when the voltage at I/O pad 240 is driven 'high' and 'low'. In some cases this drawback may be overcome by using two resistors, one connected to ground and one connected to the supply.

US 2003/0112041 A1, as illustrated in FIG. 3 shows a dual voltage supply circuit capable of switching between two alternatively activatable circuit configurations, supplying 'low' and 'high' voltages to I/O pad 350. In a first operational mode 300 of FIG. 3, I/O pad 350 is pulled 'high' to high voltage supply HVcc by turning 'on' both switch 320 connected to high supply HVcc, and switch 310 connected to the 'low' supply LVcc. In a second operational mode 305 of FIG. 3, I/O pad 350 is pulled 'low', by turning 'off' switches 320 and 310, and turning 'on' switches 340, connected to HVcc and 330 connected to LVcc. Notably, either high side switches 310, 320 are 'on' simultaneously whilst both low side switches are 'off' simultaneously, or both high side switches are 'off' simultaneously and both low side switches are 'on' simultaneously. Hence, a drawback of the circuit of FIG. 3 is that two voltage supplies are required and more power is consumed.

SUMMARY OF THE INVENTION

The present invention provides an input/output driver and integrated circuit and method therefor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG.s are illustrated for simplicity and clarity and have not necessarily been drawn to scale.

DETAILED DESCRIPTION

Figure 1:
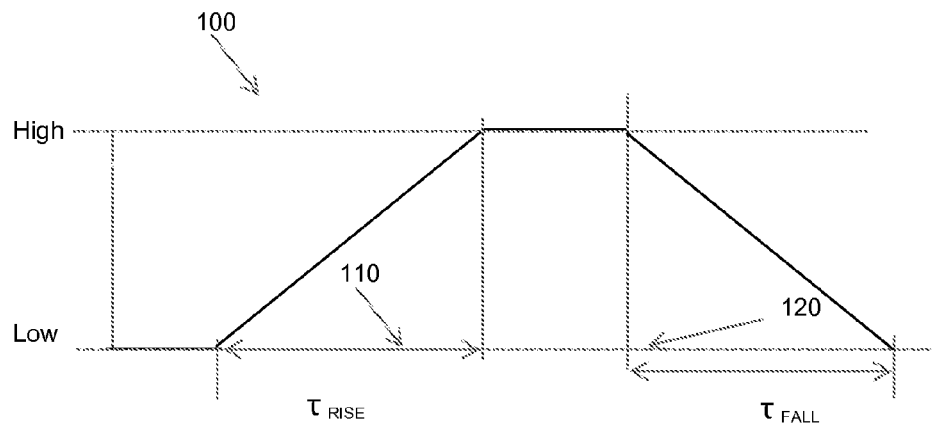
FIG. 1 illustrates a voltage switching waveform.
Figure 2:
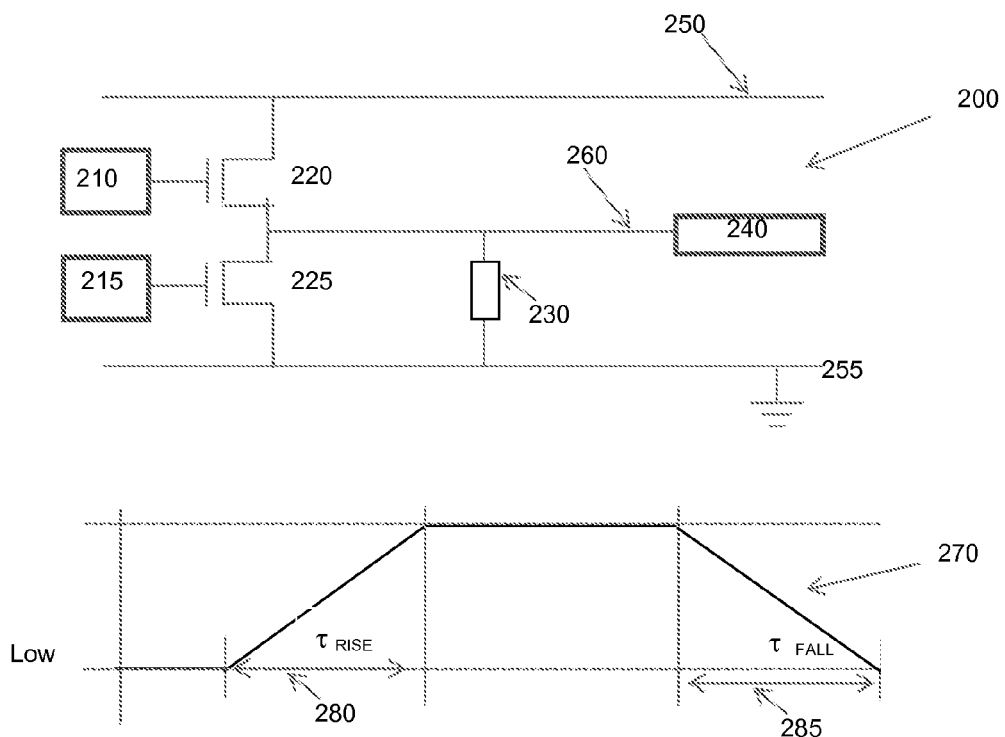
FIG. 2 illustrates a typical termination circuit and switching waveform thereof.
Figure 3:
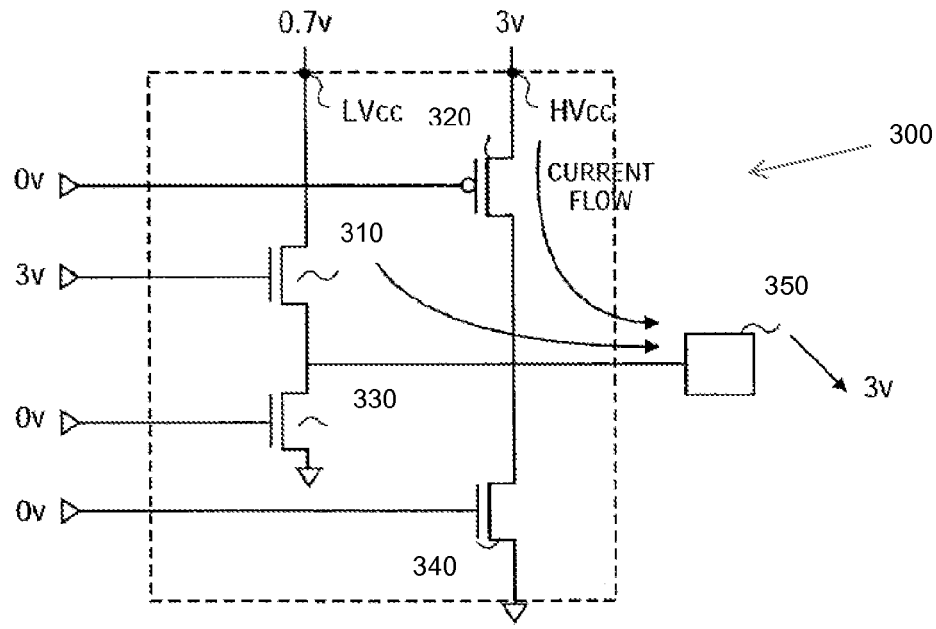
FIG. 3 illustrates a known driver circuit with two operational modes.
Figure 3:
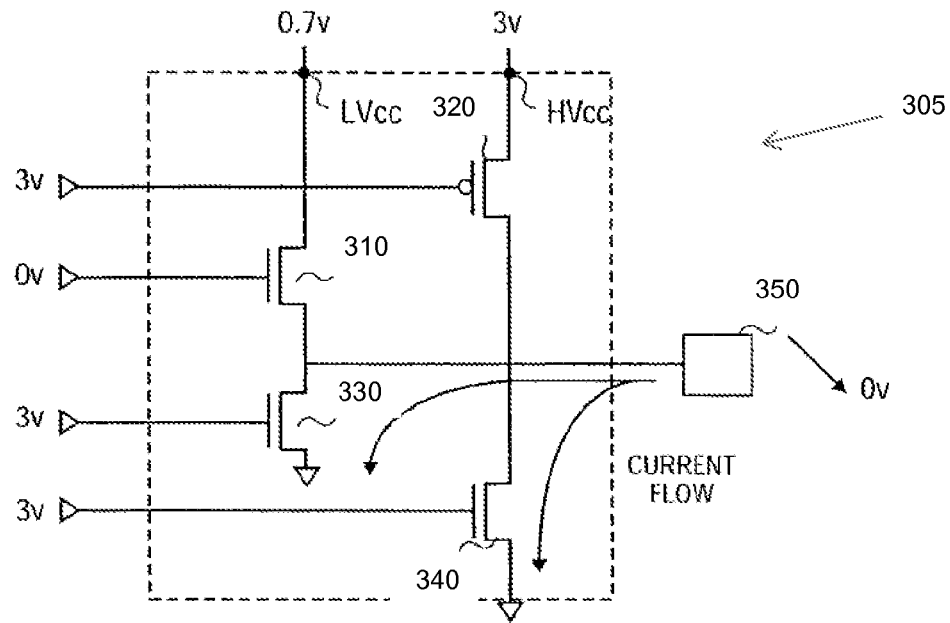

Because the illustrated embodiments of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In example embodiments, an output of an I/O driver circuit is controlled by sets of switches, such as transistors, to enable timing controllable termination of the I/O driver circuit. In example embodiments, a plurality of switches comprises two sets of switches where a first set of switches is arranged to increase a voltage output from the IO driver circuit, such that the at least one first switch and at least one second switch of the plurality of switches form at least part of the first set of switches and are arranged to initiate a voltage increase to a first intermediate voltage level and thereafter to continue the voltage change to the high voltage value. The intermediate voltage level is arranged to reside in a vicinity of a first threshold voltage level. A second set of switches is arranged to initiate a voltage decrease to a second intermediate voltage level and thereafter to continue the voltage change to the low voltage value. In some examples, existing I/O pull-up and pull-down switching drivers are used to control the sets of switches.

In example embodiments a method of operation of an exemplary driver circuit is also described. In example embodiments, the I/O driver circuit may comprise multiple stages. In some examples, multiple timing values or transition times may be separately controlled. In example embodiments the I/O driver circuit is illustrated on a separate integrated circuit to a timing circuit and control circuit coupled thereto. However, in some examples, the I/O driver circuit, timing circuit and control circuit may reside on the same integrated circuit. In example embodiments the I/O driver circuit is illustrated as comprising field effect transistor (FET) switches. However, in some examples, the I/O driver circuit may comprise any other suitable switch components, such as bipolar switches. Thus, it will be appreciated that the present invention is not limited to the specific embodiments illustrated in the drawings and described herein.

Figure 4:
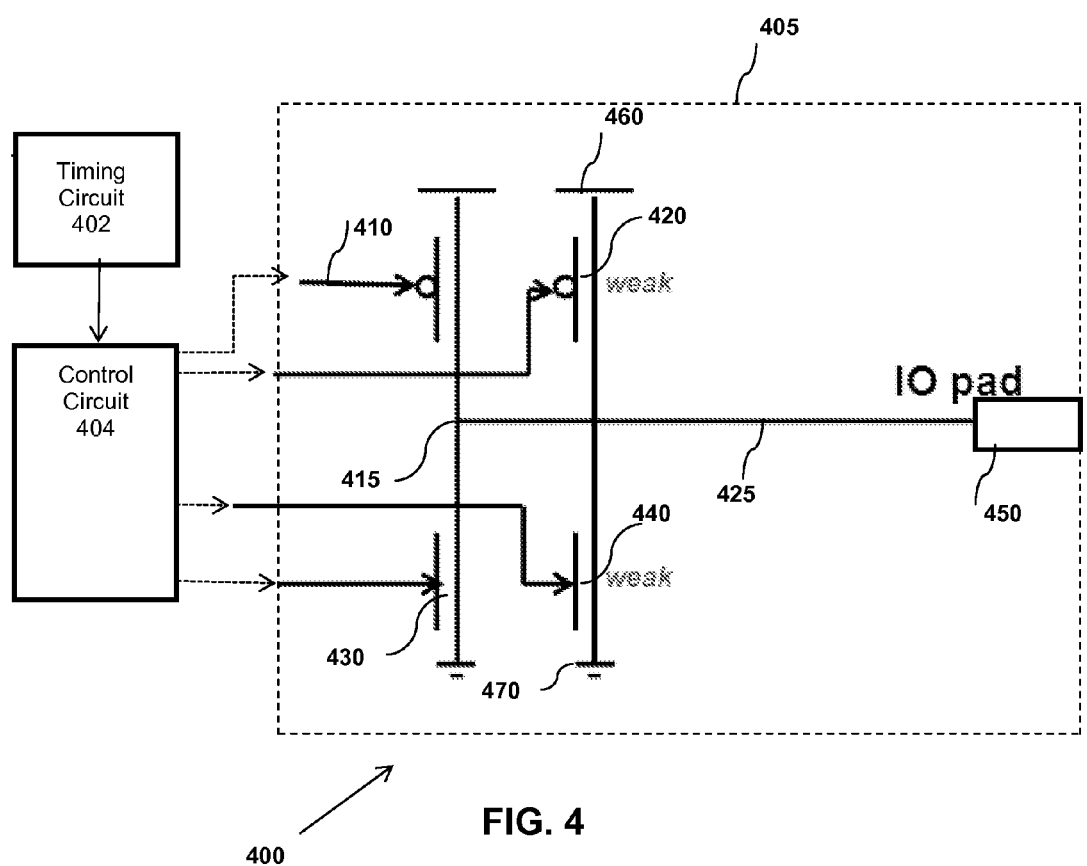
FIG. 4 illustrates one example of a driver circuit in accordance with examples of the invention.

Referring now to FIG. 4, there is illustrated a simplified example of a driver circuit 400, in accordance with an example embodiment of the invention. In the illustrated example, the driver circuit 400 comprises an integrated circuit 405 comprising a plurality of switches 410, 420, 430 and 440. In some examples, In example embodiments, the plurality of switches comprises two sets of switches such that the at least one first switch 420 and at least one second switch 410 of the plurality of switches form at least part of a first set of switches and are arranged to initiate a voltage increase to an intermediate voltage level and thereafter to continue the voltage change to the high voltage value. A second set of switches 430, 440 is arranged to initiate a voltage decrease to an intermediate voltage level and thereafter to continue the voltage change to the low voltage value.

In this illustrated example, the integrated circuit 405 is operably coupled to a control circuit 404 and a timing circuit 402. In other examples, the integrated circuit 405 may comprise the control circuit 404 and/or timing circuit 402. In other examples, the functionality of the control circuit 404 and the timing circuit 402 may be performed by a signal processor, such as a digital signal processor (DSP).

In this illustrated example, the switches 410, 420, 430 and 440 are formed of field effect transistor (FET) switches. Control gates of FET switches 410, 415, 420 and 425 are operably connected to timing circuit 404. Timing circuit 402 is shown as being operably connected to control circuit 404.

First switch 410 and second switch 420 are operably coupled at least to voltage supply 460 as well as being operably coupled to third switch 430 and fourth switch 440 respectively. Output nodes of switches 430 and 440 are operably coupled to ground. I/O pad 450 is operably coupled to node 415, located between first switch 410 and third switch 430. I/O pad 450 is also operably coupled to node 425, located between second switch 420 and fourth switch 440. In one example, second switch 420 and fourth switch 440 are configured to be independently turned 'on' or 'off', and arranged to perform only a partial voltage transition from an existing voltage level to an intermediate voltage level, prior to a full voltage transition being effected by a respective first switch 410 or third switch 430.

In this illustrated example, first switch 410 and second switch 420, and third switch 430 and fourth switch 440 are driven by I/O switching drivers (not shown) at different strengths, controlled by control circuit 404 and timing circuit 402. In another illustrated example, switches 410, 420, 430 and 440 are each driven by I/O drivers at different strengths. The switching I/O drivers (not shown) are controlled by timing circuit 402 and control circuit 404. In yet another illustrated example, switches 410, 420, 430 and 440 may be driven by I/O switching drivers at substantially the same strength.

In the above example embodiments, weak pull-up switch 420 and weak pull-down switch 440 are driven on less hard when compared to pull-up switch 410 and pull-down switch 430. Further, in the above example embodiment, pull-up switch 410 and weak pull-up switch 420 are illustrated as p-type devices and pull-down switch 430 and weak pull-down switch 440 are illustrated as n-type devices. In another example embodiment, all switches may be n-type devices. In yet another example embodiment, all switches may be p-type devices. In yet a further embodiment, the switches are a mixture of n-type and p-type devices, where opposing switches are a different type.

Figure 5:
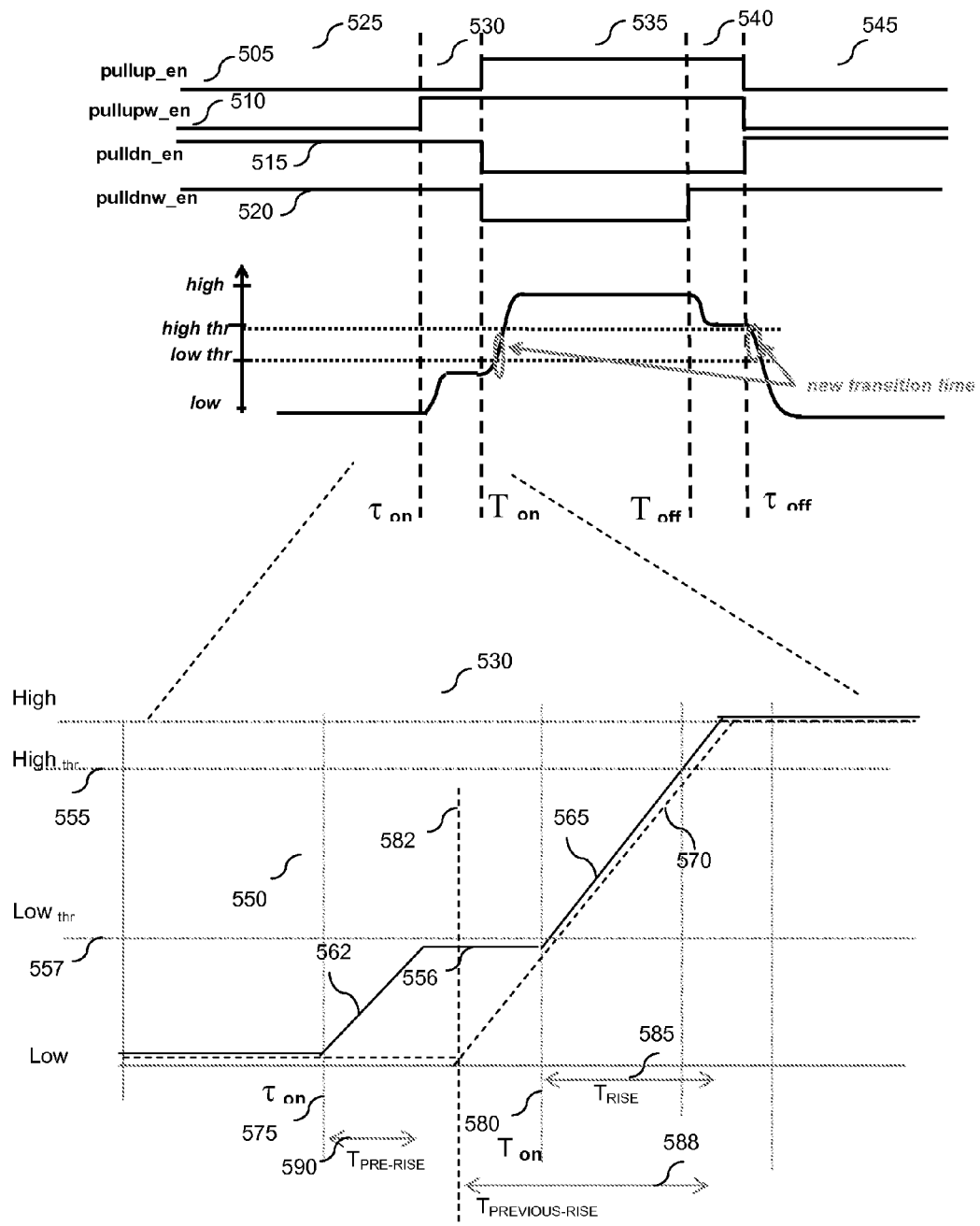
FIG. 5 illustrates an example voltage waveform-timing diagram with associated switching points for the driver circuit in FIG. 4.

Referring now to FIG. 5, an example voltage waveform-timing diagram with associated switching points for the driver circuit in FIG. 4 is illustrated, for example as output by timing circuit 404. In particular, control circuit 404 outputs a first (pull-up_en) timing signal 505 that is to be applied to first (pull-up) switch 410 of FIG. 4. Control circuit 404 also outputs a second weak (pull-upw_en) timing signal 510 that is to be applied to second (pull-upw) switch 420 of FIG. 4. Control circuit 404 also outputs a first (pull-dn_en) timing signal 515 that is to be applied to the third (pull-down) switch 430 of FIG. 4. Control circuit 404 also outputs a second weak (pull-dnw_en) timing signal 520 that is to be applied to the fourth weak (pull-down) switch 440 of FIG. 4.

FIG. 5 further illustrates an example output voltage waveform 550, for example output at I/O pad 450 of FIG. 4. The timing operation of the diagram in FIG. 5 has been split into timing regions 525-545 for ease of explanation. It should be noted that FIG. 5 illustrates only one example of possible timing operation for FIG. 4.

Referring now to first region 525 and with reference to pull-up switches 410 and 420 of FIG. 4, pull-up switches 410 and 420 are initially in this example 'off', and pull-down switches 430 and 440 are turned 'on'. Thus, the output voltage at I/O pad 450 is 'low', as illustrated by the example output voltage waveform 550 in first region 525.

Referring now to second region 530 and at, say, a predetermined time before a voltage state transition is to occur, weak pull-up switch 420 is turned 'on' at a time instant ($\tau_{on}$), where the predetermined time is: $T_{on}$-$\tau_{on}$, and where $T_{on}$ is the actual switching time instant where the voltage is to transition to a high voltage state.

In this example, second switch 420 is driven 'less hard' when compared to switches 410 and 430. In an alternative example, second (pull-up) switch 420 may be a lower voltage transistor than the first switch 410, thereby still effecting a lower voltage transition. In this example, the lower voltage provided by the second (weak, pull-up) switch 420 remains below a low threshold voltage (low_thr). During this first region 525, second (weak, pull-up) switch 420, third (pull-down) switch 430 and fourth (weak, pull-down) switch 440 are turned 'on'. In this manner, the output voltage at I/O pad 450 begins to rise to a predefined level, in this illustrated example, determined by the second switch gate voltage and saturation level. As illustrated, the predefined level is close to a low threshold level. In another example, the output voltage may rise to an undefined level, such that the voltage increase is taken over by the first switch 410 as and when dictated by the control circuit 404.

Referring now to entering the third region 535 from second region 530, and additionally referring to the circuit of FIG. 4, at time $T_{on}$ first (pull-up) switch 410 is switched 'on' (as shown in first timing signal 505) as third and fourth pull-down switches 430 and 440 are driven 'off' (as shown in third and fourth timing signals 515, 520). Therefore, the output at I/O pad 450 begins to increase again to a 'high' level, before saturating and remaining at the high voltage state throughout the rest of the third region 535.

In this example the switching 'on' and 'off' of the above switches is performed simultaneously. In another example, the above switches may be switched in a staggered fashion.

The fourth region 540 and fifth region 545 illustrate the reverse process, where an output voltage at I/O pad 450 of FIG. 4 switches from a 'high' to 'low' voltage value/state.

Referring now to entering the fourth region 540, and referring to FIG. 4, fourth (weak) pull-down switch 440 is turned 'on' at a time instant $T_{off}$ where: $\tau_{off}$ is the desired voltage transition time and $T_{off}$-$\tau_{off}$ represents a predetermined time to reduce the voltage level prior to full transition. In this example embodiment fourth (weak, pull-down) switch 440 is driven 'less hard' when compared to first pull-up switch 410 and/or third pull-down switch 430, thereby providing a 'weak' voltage transition from the high voltage level to slightly above a high threshold voltage (high_thr) level. During this fourth region 540, first second and fourth switches 410, 420 and 440 are turned 'on'. Thus, in this manner, the output voltage at I/O pad 450 begins to fall to a predefined level. In this example, the predefined level is close to a high threshold level, whereas in another example, the output voltage may fall to an undefined level.

Referring now to entering the fifth region 545, and referring to FIG. 4, third pull-down switch 430 is turned 'on' as first and second pull-up switches 410 and 420 are turned 'off'. In this example the switching 'on' and 'off' of the above switches is performed simultaneously. Therefore, the output at I/O pad 450 begins to fall to a 'low' level before saturating. In another example, the above first, second and third switches may be switched 'on'/'off' in a staggered fashion.

Advantageously, switching either second switch 420 or fourth switch 440 'on', at a predefined time before switching is required, the swing between 'low' and 'high' voltage output levels, or 'high' and 'low' voltage output levels, at I/O pad 450 is reduced when compared to a situation where there is no swing reduction mechanism employed. Thus, in this manner, the switching speed at I/O pad 450 is increased.

An expanded arrangement of the second region 530 illustrates part of the example voltage waveform 550 in more detail. As illustrated, the voltage waveform 550 comprises an initial driving stage 562, commencing at a time instant ($\tau_{on}$) 575, with the voltage increasing to a voltage level 556 that plateaus just below a low voltage threshold 557 after a $T_{pre-rise}$ period 590. The voltage waveform 550 then continues with a subsequent driving stage 565, commencing at a time instant ($T_{on}$) 580, with the voltage increasing to the 'high' voltage level that plateaus just above a high voltage threshold 555 after a $T_{rise}$ period 585.

As a comparison, the known voltage waveform 570 is illustrated with a dotted line, with a driver stage being turned on at time instant 582 and, as shown, requiring a longer rise time ($T_{previous-rise}$ period 588) to reach the same 'high' voltage level.

Thus, as the two waveforms 565, 570 commence from differing voltage levels, the time taken (e.g. $T_{rise}$ period 585 and $T_{previous-rise}$ period 588) for waveforms 565, 570 to reach the same 'high' voltage level is different. Therefore the switching speed of waveform 565, utilising swing reduction, is increased. It should be noted that substantially the reverse process is applied when switching from 'high' to 'low', as illustrated in FIG. 5 fourth region 540.

Figure 6:
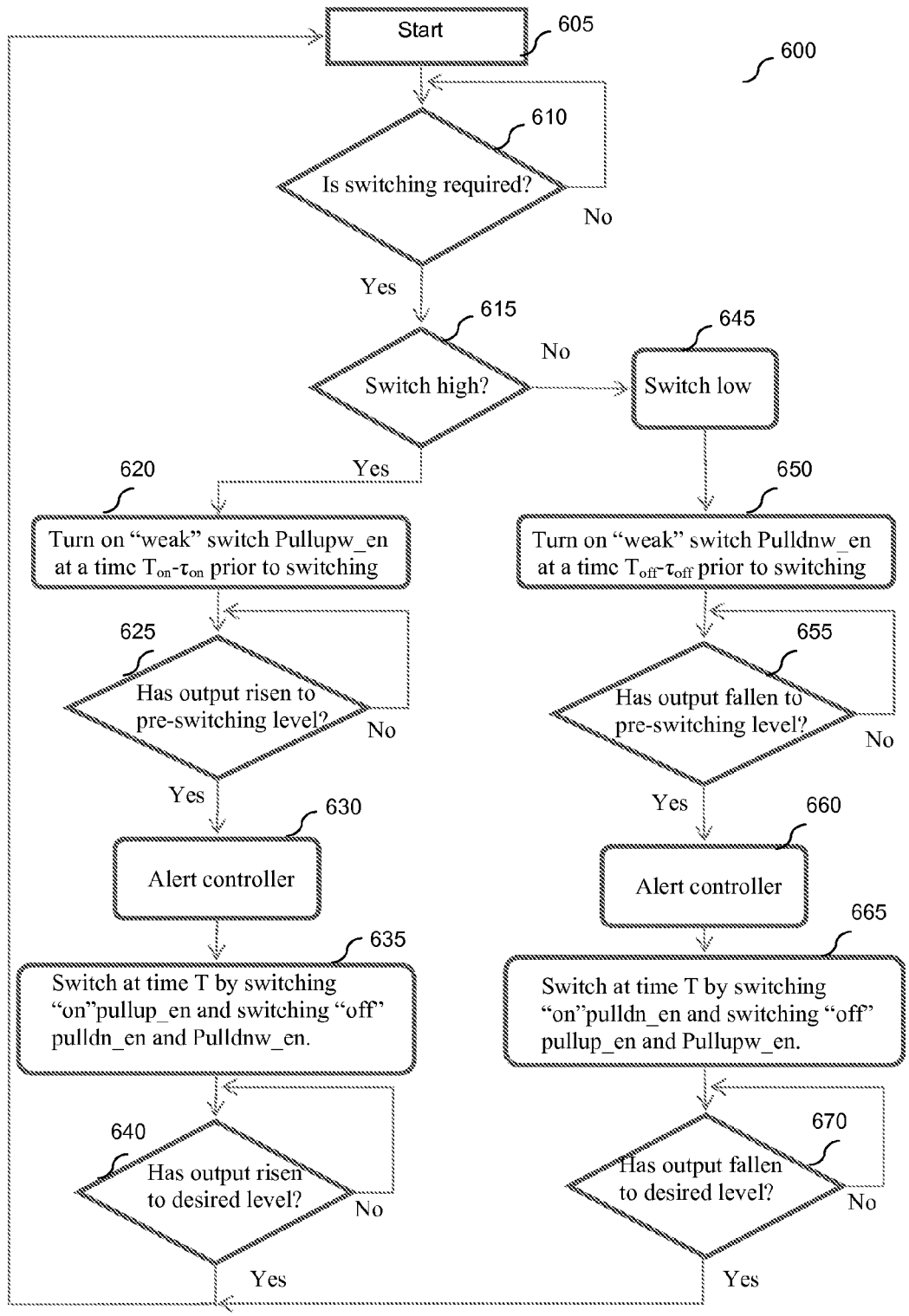
FIG. 6 illustrates a flowchart example of a method of operation of an exemplary driver circuit.

Referring now to FIG. 6, a flowchart example 600 of a method of operation of an exemplary driver circuit is illustrated. The flowchart commences in 605 and a determination is made in 610 as to whether switching between voltage states is required in the I/O driver circuit, say I/O driver circuit 400 of FIG. 4. If no switching between the voltage states is required in 610, the process loops as shown. If switching between voltage states is required in 610, a determination is made as to whether the current voltage state is 'high' in 615.

If the current voltage state is 'high' in 615, a weak pull-up switch is turned 'on' (e.g. pull-upw_en) a predetermined time prior to full switching being required in 620. A determination is then made as to whether the output voltage level has risen to a pre-switching threshold level in 625. If the output voltage level has not risen to a pre-switching threshold level in 625, the process loops as the voltage level continues to increase. If the output voltage level has risen to a pre-switching threshold level in 625, the control circuit is alerted in 630 and the waveform reaches a temporary steady state. Subsequently, in 635 and at time 'T', a primary pull-up switch, e.g. first pull-up switch 410 in FIG. 4, is turned 'on', and primary and weak pull-down switches, e.g. third pull-down switch 430 and fourth pull-down switch 440 in FIG. 4, are turned 'off'. A determination is then made as to whether the output voltage level has risen to a desired/second threshold level in 640. If the output voltage level has not risen to a desired/second threshold level in 640, the process loops as the voltage level continues to increase. If the output voltage level has risen to the desired/second threshold level in 640, then the voltage has reached a steady state level and the process loops to 605.

If the current voltage state is not 'high' in 615, the voltage is to be switched 'low' in 645. A weak pull-down switch is turned 'on' (e.g. pull-dnw_en) a predetermined time prior to full switching being required in 650. A determination is then made as to whether the output voltage level has fallen to a pre-switching threshold level in 655. If the output voltage level has not fallen to the pre-switching threshold level in 655, the process loops as the voltage level continues to decrease. If the output voltage level has fallen to a pre-switching threshold level in 655, the control circuit is alerted in 660 and the waveform reaches a temporary steady state. Subsequently, in 665 and at time 'T', a primary pull-down switch, e.g. third pull-down switch 430 in FIG. 4, is turned 'on', and primary and weak pull-up switches, e.g. first pull-up switch 410 and second pull-up switch 420 in FIG. 4, are turned 'off'. A determination is then made as to whether the output voltage level has fallen to a desired/third threshold level in 670. If the output voltage level has not fallen to a desired/third threshold level in 670, the process loops as the voltage level continues to decrease. If the output voltage level has fallen to the desired/third threshold level in 670, then the voltage has reached a steady state level and the process loops to 605.

Figure 7:
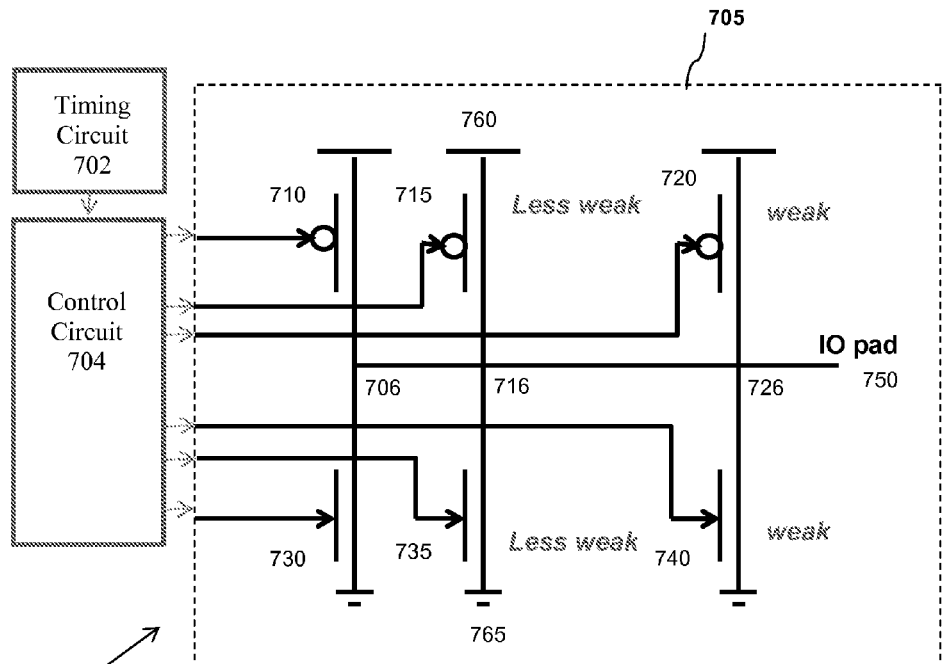
FIG. 7 illustrates a further example of a driver circuit in accordance with examples of the invention.

Referring now to FIG. 7, there is illustrated a further simplified example of a driver circuit 700. In this example, the intermediate voltage level state has been extended to two intermediate states by adding two 'weak' transistor stages, one each for the 'up' transition and 'down' transition. In this manner, a 'weak' transistor stage and a 'less weak' transistor stage is provided.

The operation of the circuit of FIG. 7 has similarities to the operation of the example circuit illustrated in FIG. 4. In the illustrated example, the driver circuit 700 comprises an integrated circuit 705 comprising a plurality of switches 710, 715, 720, 730, 735 and 740. In this illustrated example, the integrated circuit 705 is operably coupled to a timing circuit 704 and a control circuit 702. In other examples, the integrated circuit 705 may comprise the control circuit 704 and/or the timing circuit 702. In other examples, the functionality of the timing circuit 704 and the control circuit 702 may be performed by a signal processor, such as a digital signal processor (DSP).

In this illustrated example, the switches 710, 715, 720, 730, 735 and 740 are formed of field effect transistor (FET) switches. Control gates of FET switches 710, 715, 720, 730, 735 and 740 are operably connected to timing circuit 704. Timing circuit 702 is shown as being operably connected to control circuit 704. First switch 710, second switch 720 and fifth switch 715 are operably coupled at least to voltage supply 760 as well as being operably coupled to third switch 730, fourth switch 740 and sixth switch 735 respectively. Output nodes of switches 730, 735 and 740 are operably coupled to ground 765. I/O pad 750 is operably coupled to node 706, located between first switch 710 and third switch 730. I/O pad 750 is also operably coupled to node 716, located between fifth switch 715 and sixth switch 735. I/O pad 750 is also operably coupled to node 726, located between second switch 720 and fourth switch 740.

In one example, second switch 720 and fourth switch 740 are configured to be independently turned 'on' or 'off', and arranged to perform only a partial voltage transition from an existing voltage level to an intermediate voltage level, prior to a full voltage transition being effected by a respective first switch 710 or third switch 730. In one example, fifth switch 715 and sixth switch 735 are also configured to be independently turned 'on' or 'off', prior to second switch 720 and fourth switch 740. In this manner, fifth switch 715 and sixth switch 735 are also arranged to perform only even a less partial voltage transition from an existing voltage level to a further intermediate voltage level, prior to the partial voltage transition being effected by a respective second switch 720 or fourth switch 740 and the full voltage transition being effected by a respective first switch 710 or third switch 730.

In this illustrated example, each of switches 710, 715, 720, 730, 735 and 740 are driven by I/O switching drivers (not shown) at different strengths, controlled by control circuit 704 and timing circuit 702. In another illustrated example, switches 710, 715, 720, 730, 735 and 740 may be each driven by I/O drivers at different strengths. The switching I/O drivers (not shown) are controlled by timing circuit 702 and control circuit 704. In yet another illustrated example, switches 710, 715, 720, 730, 735 and 740 may be driven by I/O switching drivers at substantially the same strength.

In the above example embodiments, weak pull-up switch 720 and weak pull-down switch 740 are driven on less hard when compared to pull-up switch 710 and pull-down switch 730.

The operation of the driver circuit of FIG. 7 will now be described with reference to FIG. 8. The operation of this circuit is substantially the same as that in FIG. 4, therefore only additional functionality will be explained in detail.

Figure 8:
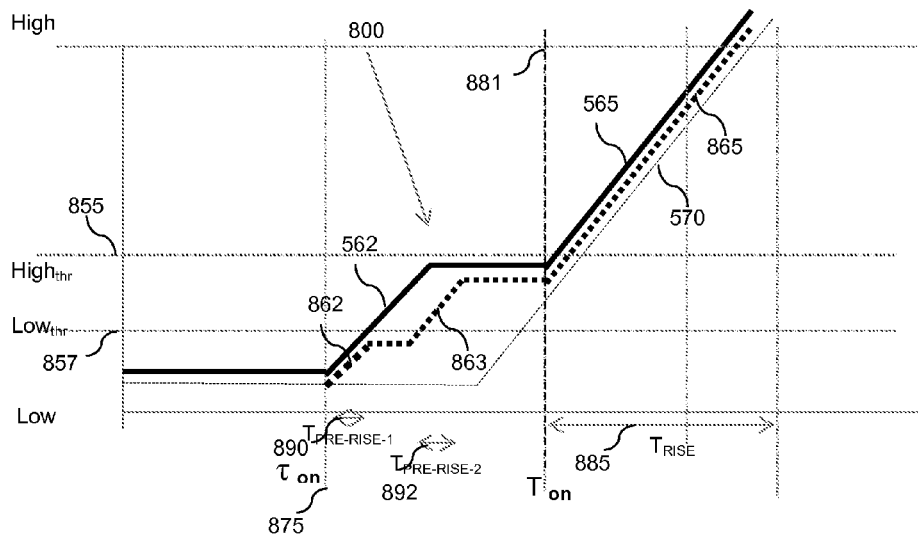
FIG. 8 illustrates an example voltage waveform-timing diagram with associated switching points for the driver circuit in FIG. 7.

FIG. 8 illustrates a series of voltage waveforms 800, including voltage waveforms 562 and 565 according to FIG. 5 and known waveform 570. Additionally, in accordance with the operation of FIG. 7, a dual transition stage comprising a first voltage waveform increase 862 during a first pre-rise period 890 and a second voltage waveform increase 863 during a second pre-rise period 892. In this example embodiment, the voltage waveform starts 'low', with switches 710, 715, 720 turned 'off'. At 875 ($\tau_{on}$) switch 720 is driven 'on' and thus the voltage waveform 862 rises to a first predetermined level between low and low threshold 857, during a first pre-rise period 890 and switch 715 is driven 'on' and thus the voltage waveform 863 rises to a second predetermined level between low threshold 857 and high threshold 855, during a second pre-rise period 892, whereas switches 730, 735 and 745 are turned 'off'. At 881, after a predefined time, switch 710 is also driven 'on' and voltage waveform 865 rises to a predetermined level just below the 'high' threshold.

In this example embodiment, two pairs of switches are used to control the pre-'on' state. In this example, switches 715 and 735 are driven less hard than switches 710 and 730, and switches 720 and 740 are driven less hard than switches 710, 715, 730 and 735. The reverse process is applied when switching low switches 'on', that is, switching the I/O Pad 750 from 'high' to 'low'. In another example, the two pairs of switches that are used to control the pre-'on' and pre-'off' state may be switched together. In yet another example, the two pairs of switches may be switched together, but with a time delay between the pair of switches. In yet a further example, one of the switches of the pair of switches maya be switched 'off' after a predefined time.

Thus, an input/output (IO) driver circuit is described. The IO buffer driver circuit comprises: at least one input for receiving an input signal and at least one output for outputting at least one output signal; and a plurality of switches arranged to provide a variable voltage level between a low voltage value and a high voltage value to the at least one output. The at least one first switch of the plurality of switches is arranged to initiate a voltage change to an intermediate voltage level between the low voltage value and the high voltage value in a first time period. The at least one second switch of the plurality of switches is arranged to continue the voltage change to the low voltage value or the high voltage value in a second time period. In one example, the first time period may be configured to overlap with the second time period, in that the activation of the subsequent switch/transistor may be effected before the voltage supplied by the activation of the earlier switch/transistor has plateaued. In yet another example, the first time period may be configured to not overlap with the second time period, as illustrated in the aforementioned examples.

Additionally, a method of providing an output for an input/output driver circuit comprises a plurality of switches arranged to provide a variable voltage level between a low voltage value and a high voltage value is described. The method comprises: applying a first variable input signal to at least one first switch of the plurality of switches thereby initiating a voltage change output from the input/output driver circuit to an intermediate voltage level between the low voltage value and the high voltage value in a first time period; applying a second variable input signal to at least one second switch of the plurality of switches thereby continuing the voltage change in a second time period; and outputting the low voltage value or the high voltage value output from the input/output driver circuit.

In the foregoing specification, the invention has been described with reference to specific examples of embodiments of the invention. It will, however, be evident that various modifications and changes may be made therein without departing from the broader spirit and scope of the invention as set forth in the appended claims, and that accordingly these are not limited to the examples described.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An input/output (IO) driver circuit comprising:
at least one input for receiving an input signal and at least one output for providing at least one output signal;
a plurality of switches arranged to provide a variable voltage level between a low voltage value and a high voltage value to the at least one output, wherein
at least one first switch of the plurality of switches is arranged to initiate a voltage change to an intermediate voltage level between the low voltage value and the high voltage value in a first time period, wherein the voltage change to the intermediate voltage level is an increasing voltage change that is followed by a decreasing voltage change to a second different intermediate voltage level, and
at least one second switch of the plurality of switches is arranged to continue the voltage change to the low voltage value or the high voltage value in a second time period.

2. The I/O driver circuit of claim 1 wherein the plurality of switches comprises two sets of switches such that the at least one first switch and the at least one second switch of the plurality of switches form at least part of a first set of switches that is turned 'on' whilst a second set of switches is turned 'off'.

3. The I/O driver circuit of claim 2 wherein the first set of switches is arranged to initiate a voltage increase to the intermediate voltage level through turning 'on' of the at least one first switch and thereafter to continue the voltage change to the high voltage value through turning 'on' of the at least one second switch.

4. The I/O driver circuit of claim 3 wherein the second set of switches is arranged to initiate a voltage decrease to an intermediate voltage level and thereafter to continue the voltage change to the low voltage value.

5. The I/O driver circuit of claim 1 wherein the at least one first switch is either a weak pull-up switch or a weak pull-down switch that is driven on less hard than a respective at least one pull-up second switch or pull-down second switch.

6. The I/O driver circuit of claim 1 wherein the at least one first switch is arranged to initiate the voltage change to the intermediate voltage level that resides in a vicinity of a threshold voltage level.

7. The I/O driver circuit of claim 1 wherein the first time period is different to the second time period.

8. The I/O driver circuit of claim 1 wherein the first time period does not overlap the second time period.

9. The I/O driver circuit of claim 1 wherein the first time period overlaps the second time period.

10. The I/O driver circuit of claim 1 further comprising a control circuit operably coupled to a timer circuit arranged to ensure that at least one of the following conditions exist: that the first time period is different to the second time period, that the first time period does not overlap the second time period.

11. The I/O driver circuit of claim 1 wherein the plurality of switches comprise a plurality of transistors arranged to enable timing controllable termination of the I/O driver circuit.

12. An integrated circuit comprising the I/O driver circuit of claim 1.

13. An input/output (IO) driver circuit comprising:
    at least one input for receiving an input signal and at least one output for providing at least one output signal; and
    a plurality of switches arranged to provide a variable voltage level between a low voltage value and a high voltage value to the at least one output, wherein
    a first switch of the plurality of switches is arranged to initiate a voltage change to a first intermediate voltage level in a first intermediate time period,
    a second switch of the plurality of switches is arranged to initiate a voltage change to a second intermediate voltage level in a second intermediate time period, and
    at least one third switch of the plurality of switches is arranged to continue the voltage change to the low voltage value or the high voltage value in a third intermediate time period.

14. The I/O driver circuit of claim 13 wherein the first switch is either a weak pull-up switch or a weak pull-down switch that is driven on less hard than a respective pull-up second switch or pull-down second switch.

15. The I/O driver circuit of claim 13 wherein the first switch is arranged to initiate the voltage change to the first intermediate voltage level that resides in a vicinity of a threshold voltage level.

16. A method of providing an output for an input/output driver circuit comprising a plurality of switches arranged to provide a variable voltage level between a low voltage value and a high voltage value, the method comprising:
    applying a first variable input signal to at least one first switch of the plurality of switches thereby initiating a voltage change output from the input/output driver circuit to a first intermediate voltage level between the low voltage value and the high voltage value in a first time period;
    applying a second variable input signal to at least one second switch of the plurality of switches thereby continuing the voltage change in a second time period;
    applying a third variable input signal to at least one third switch of the plurality of switches thereby initiating a voltage change to a second intermediate voltage level in a second intermediate time period prior to applying the second variable input signal to the at least one second switch; and
    outputting the low voltage value or the high voltage value from the input/output driver circuit.

17. The method of claim 16 wherein the voltage change to an intermediate voltage level comprising:
    initiating an increasing voltage change that is followed by a decreasing voltage change to a second different intermediate voltage level.

18. The method of claim 16 wherein the at least one first switch is either a weak pull-up switch or a weak pull-down switch that is driven on less hard than a respective at least one pull-up second switch or pull-down second switch.

* * * * *